(12) United States Patent
Wong et al.

(10) Patent No.: US 7,224,379 B2
(45) Date of Patent: May 29, 2007

(54) PRINTER USING DIRECT-COUPLED EMISSIVE ARRAY

(75) Inventors: Victor C. Wong, Rochester, NY (US); Badhri Narayan, Rochester, NY (US); Gareth B. Evans, Potten End (GB)

(73) Assignee: Eastman Kodak Company, Rochester, NY (US)

( * ) Notice: Subject to any disclaimer, the term of this patent is extended or adjusted under 35 U.S.C. 154(b) by 401 days.

(21) Appl. No.: 10/838,032

(22) Filed: May 3, 2004

(65) Prior Publication Data

US 2005/0243161 A1 Nov. 3, 2005

(51) Int. Cl.
*B41J 2/45* (2006.01)

(52) U.S. Cl. ........................... 347/238

(58) Field of Classification Search ............... 347/138, 347/233–244, 246–254, 256–258, 41, 130–134; 385/120; 438/29; 359/341.1; 362/551–556
See application file for complete search history.

(56) References Cited

U.S. PATENT DOCUMENTS

| | | | |
|---|---|---|---|
| 4,389,655 A * | 6/1983 | Baues ..................... 347/241 |
| 4,484,233 A | 11/1984 | Strout et al. |
| 4,728,965 A | 3/1988 | Kessler et al. |
| 4,754,334 A | 6/1988 | Kriz et al. |
| 4,921,316 A * | 5/1990 | Fantone et al. ............. 385/120 |
| 4,999,648 A * | 3/1991 | Debesis ..................... 347/241 |
| 5,303,056 A | 4/1994 | Constable |
| 5,461,411 A | 10/1995 | Florence et al. |
| 5,652,661 A | 7/1997 | Gallipeau et al. |
| 6,388,698 B1 * | 5/2002 | Deguchi et al. ............ 347/240 |
| 6,763,167 B2 * | 7/2004 | Gaudiana et al. ........... 385/120 |
| 6,816,181 B2 * | 11/2004 | Ohkubo ..................... 347/238 |
| 6,844,888 B2 * | 1/2005 | Nakamura .................. 347/138 |
| 6,924,160 B2 * | 8/2005 | Wei et al. ..................... 438/29 |

\* cited by examiner

*Primary Examiner*—Hai Pham
(74) *Attorney, Agent, or Firm*—Nelson Adrian Blish

(57) ABSTRACT

A contact printing apparatus (100), using a direct-coupled emissive array (20) of individual light emitting pixels (22), forms an image from digital data onto a photosensitive medium (16). The direct-coupled emissive array (20) is fabricated on an optically coupled substrate (25) that provides light-directing elements, such as a lenslet array or fiber optic faceplate (40) for directing light from emitter pixels (22) to print pixel (71) locations on the photosensitive medium (16).

4 Claims, 12 Drawing Sheets

PRINTER USING DIRECT-COUPLED EMISSIVE ARRAY

CROSS REFERENCE TO RELATED APPLICATIONS

Reference is made to commonly-assigned copending U.S. patent application Ser. No. 10/201,338, filed Jul. 23, 2002, entitled OLED DISPLAYS WITH FIBER-OPTIC FACEPLATES, by Cok et al., the disclosure of which is incorporated herein.

FIELD OF THE INVENTION

This invention generally relates to printing apparatus and more particularly relates to a printer for forming an image using a direct-coupled photoemissive array.

BACKGROUND OF THE INVENTION

A number of different imaging technologies have been employed for recording images from digital data onto photosensitive media. Technologies adapted for digital printing onto photosensitive media include cathode ray tube (CRT), scanned laser beam, liquid crystal display (LCD) and digital micromirror device (DMD) technologies. Each of these imaging technologies achieves some measure of success for producing high quality prints competitive with more traditional optical imaging approaches.

In a CRT-based printer, digital image data modulates an electron beam, providing variable exposure energy as the beam scans across a phosphorescent screen. The emitted light is conditioned by color filters, then directed to the media through imaging optics. Examples of CRT-based systems include those disclosed in U.S. Pat. No. 4,754,334 (Kriz et al.) and in U.S. Pat. No. 5,303,056 (Constable).

In a laser-based printer, digital image data modulates the on-time duration or the intensity of a laser beam that is scanned across the media surface by a rotating reflector, such as a mirrored polygon. Relatively complex F-Theta optics are generally required for laser printing in order to minimize polygon-related artifacts and to provide the desired print resolution. One example of a laser-based printer is disclosed in U.S. Pat. No. 4,728,965 (Kessler et al.)

LCDs and DMDs are spatial light modulators that offer another alternative imaging solution. A spatial light modulator can be considered essentially as a one-dimensional (linear) or two-dimensional (area) array of light-valve elements, each element corresponding to an image pixel. In an LCD-based printer, digital image data modulates the polarization state of an incident optical beam. One example of an LCD-based printer is disclosed in U.S. Pat. No. 5,652,661 (Gallipeau et al.) In a DMD-based printer, digital image data modulates electrostatically deflectable mirrors, each corresponding to a single image pixel. One example of a DMD-based printer is disclosed in U.S. Pat. No. 5,461,411 (Florence et al.) Printing apparatus using either an LCD or a DMD spatial light modulator requires both illumination optics, to condition and direct incident light from a light source, and projection optics for directing modulated light onto the photosensitive medium.

While varying degrees of success have been achieved in deploying each of these technologies, some drawbacks remain. CRT imaging devices, for example, are bulky, limited in resolution, and relatively expensive. Laser scanning devices are characterized by relatively high cost and substantial optical and mechanical complexity. LCD-based printers require supporting optical systems for uniformization, polarization, illumination, and focusing of the modulated light. DMD printers also require costly support optics and are limited in the available resolution. Supporting optics for digital printing systems employing CRT, scanned laser, LCD, and DMD imaging devices add cost, size, and complexity to printing apparatus design. The significant size, complexity, and cost requirements prevent the building of compact digital printing systems, such as for handheld applications, and it can be seen that there is a need for a digital printing apparatus with simpler design and smaller form factor.

Photoemissive area arrays, such as the various types of organic light emitting diode (OLED) devices, have been developed chiefly for imaging as display devices. However, it has been recognized that there may be advantages to using OLED devices for printing onto photosensitive media. Photoemissive arrays can act as both light modulators and light emitters, and they can print a full image frame at a time. By eliminating the need of additional light source and illumination optics, photoemissive arrays can be employed to provide simplification to the design of printer systems. However, they still require separate projection optics for image forming on photosensitive media. Referring to FIG. 1, there is shown the basic optical path for a prior art printing apparatus 10 employing an conventional emissive array 19 with a lens 14 for imaging onto a photosensitive medium 16. Lens 14 could use a single element, as represented in FIG. 1, but would more likely include multiple optical elements, with chromatic correction, for example. The need for projection optics still poses limitations to the use of OLED devices in building very compact printer systems.

A notable configuration for printer design is contact printing, where an image is printed onto a photosensitive medium that is placed against or very near the exposing surface of a printhead. Without the use of interposed optics for imaging, contact printing has the advantage of allowing the implementation of potentially compact printer systems, but is not suitable for many digital printing technologies. In particular, light path constraints prevent laser-, LCD- and DMD-based imaging systems from being used in contact printing configuration. There has been disclosures of CRT-based digital printer designs utilizing contact printing. For example, as is disclosed in U.S. Pat. No. 4,484,233 (Strout et al.), CRT imaging is used in conjunction with a specially manufactured and treated fiber optic faceplate for forming an exposure image directly at the photosensitive media plane. Notably, the apparatus of U.S. Pat. No. 4,484,233 is sizable, requiring substantial depth for forming and modulating the imaging beam. Thus, although the apparatus of U.S. Pat. No. 4,484,233 does not require lens components for exposure of the photosensitive medium, it does require a sizable CRT system and a fiber optic faceplate that is specially designed and would be costly and not suitable for compact applications.

There is also an inherent device limitation that limits the suitability of OLED devices for use in contact printing designs. OLED devices are conventionally fabricated onto a glass substrate. Light emitted from the OLED material is dispersed as it travels through the transparent glass substrate. This causes a loss of sharpness and contrast, so that external supporting optics are generally unavoidable in order to use OLED devices in high resolution, high quality printing applications. Furthermore, OLED light emission is Lambertian, emitting equally in all directions. This is problematic for printing applications in that a significant fraction of the light from an OLED emitter at one pixel location exits the substrate at another pixel location, causing undesirable crosstalk. This further reduces sharpness and contrast for the image exposed on a photosensitive medium in contact printing configuration.

Thus, while the use of photoemissive arrays such as OLED offers the potential of achieving a compact printer design, inherent device limitations, as conventionally fabricated and deployed, prevent further simplification of printer design. There is, as yet, no clear solution of designing a high quality, photoemissive array printer without the cost, complexity, and space requirements of the optical subsystem between the printhead and the photosensitive medium. It can be seen that there is a need for improvement in a printing apparatus and method that achieves very compact printing at high image quality.

SUMMARY OF THE INVENTION

It is an object of the present invention to provide an apparatus and method that provides high quality output prints and enjoys the advantages of contact printing, using an emissive array without an intervening optical subsystem. With this object in mind, the present invention provides a printing apparatus for forming an image from digital data onto a photosensitive medium comprising:

an emissive array for forming an exposure image according to the digital data, the emissive array fabricated on a substrate and comprising a plurality of individual light emitting elements, wherein each light emitting element corresponds to a pixel in the digital data, the intensity of each light emitting element varying according to the data value for each pixel; and the substrate comprising an array of light directing elements, such that each light emitting element in the emissive array has a corresponding light directing element for directing light from the light emitting element to a print pixel location on the photosensitive medium.

A feature of the present invention is the use of a direct-coupled lens element for directing light from each individual light emitting element. A number of optical configurations can be employed to provide the mechanism for coupling light from the light emitting element. In the preferred embodiment, the light emitting elements are fabricated on a substrate which has an embedded array of micro-lens structure. In an alternate embodiment, a substrate having a micro-lens array formed on an outer surface can be used in conjunction with the light emitting elements. Each micro-lens would then collect a large fraction of the emitted light and focus that light onto the adjacent surface of the photosensitive medium.

It is an advantage of the present invention that it provides a compact and potentially low-cost component arrangement for printing using a direct-coupled emissive array. The printing apparatus of the present invention uses a minimum number of components, not requiring optical components except those integrated into the direct-coupled emissive array, and provides the advantages of the contact printing model described in the background section above. The printing apparatus of the present invention could be used in a hand-held embodiment.

It is a further advantage of the present invention that it provides highly efficient use of light, providing an image having good sharpness and contrast.

These and other objects, features, and advantages of the present invention will become apparent to those skilled in the art upon reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Photoemissive area arrays adaptable for printing applications can be constructed from a variety of materials. The preferred embodiment in the present invention makes use of organic light emitting diode (OLED) arrays, using organic electroluminscence technology. The light emitting material itself may be characterized as being of the small-molecule kind or of the polymer kind. In some of the current literature, small-molecule organic electroluminescent devices are labeled as "OLED" devices and distinguished from polymer organic electroluminescent devices, labeled "PLED" devices. For the purposes of this application, however, all of these classes of organic electroluminescent devices, including both small-molecule and polymer varieties, are simply referred to as "OLED" and can be considered for use as an electroluminescent image source.

Figure 2:
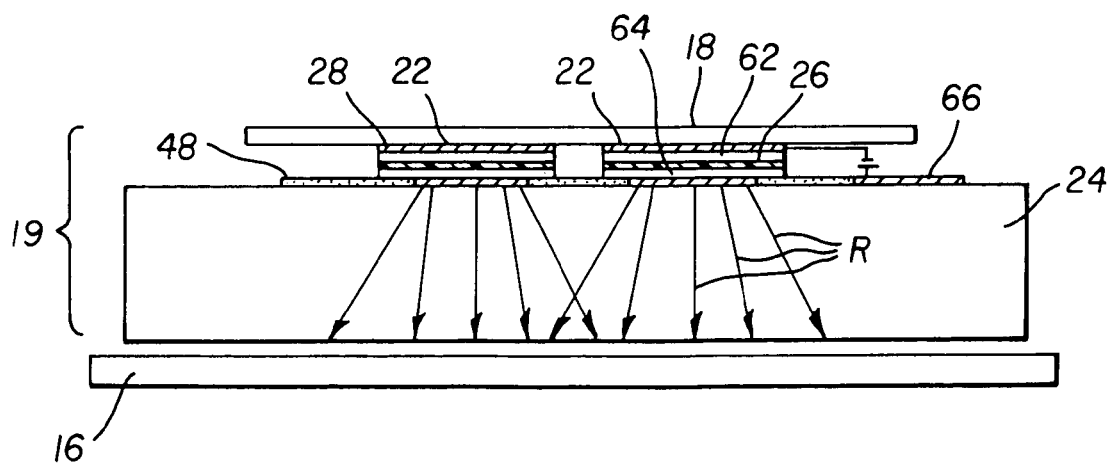
FIG. 2 is a cross-sectional side view of emitter pixel locations on a conventional emissive array.

Referring to FIG. 2, there is shown, in cross-sectional view (not to scale), the basic structural makeup of a conventional OLED emissive array 19, with two emitter pixels 22 shown beneath a backing element 18. A transparent anode 66, typically of indium-tin-oxide (ITO), is deposited as an electrode on a transparent, conventional glass substrate 24, with an opaque insulator 48 deposited for defining emitter pixel 22 locations. At each emitter pixel 22, an emitting layer 26 and, typically, one or more additional layers of organic material are then deposited atop this electrode, typically including a hole transport layer 64 and an electron transport layer 62. A metal cathode 28 is then deposited to form the diode structure. A backing element 18 is also provided. The total thickness of organic layers is on the order of 100 nm; most of the thickness of the OLED device is due to transparent glass substrate 24. When emitter pixel 22 is energized, emitting layer 26 emits light rays R, which travel through conventional glass substrate 24. This is generally referred to as a bottom-emitting device structure.

An OLED array can be fabricated as a two dimensional monochromatic array of pixels or as a tri-color side-by-side pixel array, or even as a tri-color stacked pixel array. The array sizes, pixel pitch, and aspect ratios can be manufactured in a variety of resolutions and densities. Each pixel site in a tri-color side-by-side or stacked array comprises three light emitting diodes of different colors. Each light emitting diode in a tri-pixel site, and therefore the entire array, can be individually controlled through separate electrode structures to display a full-color visual image.

Figure 1:
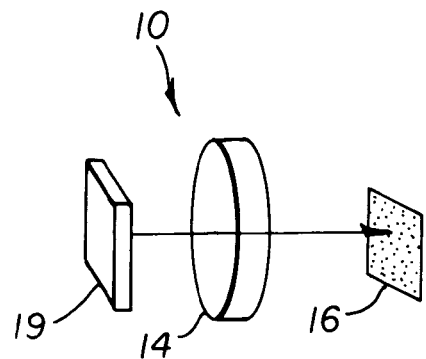
FIG. 1 is a schematic representation showing the arrangement of components in a prior art printing apparatus using an emissive array.

In order to use the emissive array in printing applications, the displayed image generally needs to be imaged by optical means onto an exposing media. In prior arts such as illustrated in FIG. 1, optical means is a projection lens 14, positioning between the conventional emissive array 19 and photosensitive medium 16. The projection lens 14 takes up additional space and is undesirable for use in a space sensitive system. Because the emitter pixels are conventionally fabricated onto a glass substrate, it is not possible to form high quality image on photosensitive media placed directly against the device, i.e., in contact printing configuration. Referring to FIG. 2, when emitter pixel 22 is energized, emitting layer 26 emits light rays R, which travel through conventional glass substrate 24. When emitted light rays R reaches the rear surface of conventional glass substrate 24, they are sufficiently dispersed to blur the pixel. Dispersion through conventional glass substrate 24 also causes crosstalk to occur between emitter pixels 22, resulting in further loss of sharpness and contrast for the image exposed on photosensitive medium 16. The present invention makes use of a direct-coupled scheme to print high resolution, high contrast images without the need of external optical means, thus taking advantage of the simplicity of contact printing to allow for a high quality, but compact and potentially low cost system.

Printhead Design

Figure 3A:
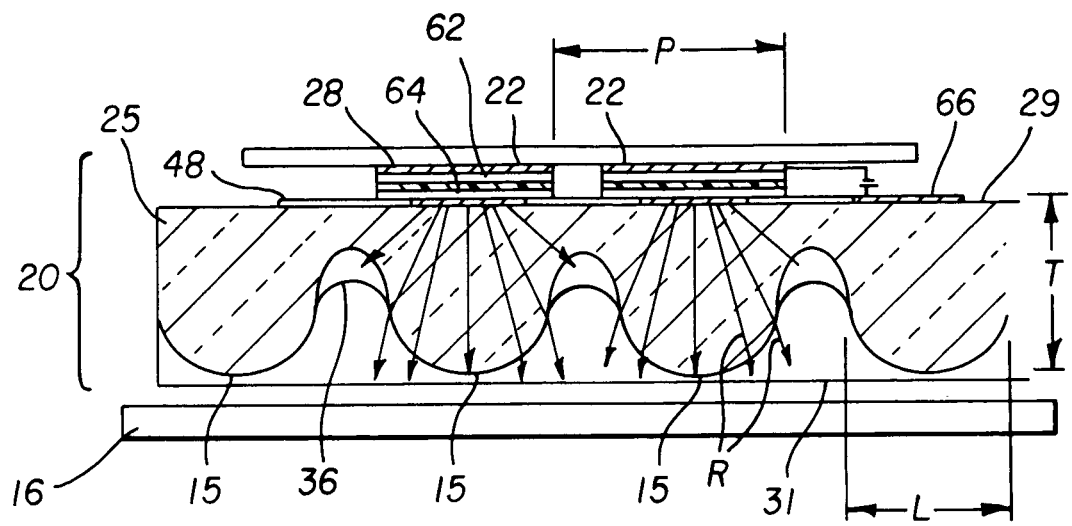
FIG. 3a is a cross-sectional side view of a direct-coupled emissive array device adapted for use in a contact printing apparatus, in the preferred embodiment of the present invention.

Referring to FIG. 3a, there is shown the preferred embodiment of the present invention, with a cross-sectional view of two emitter pixels 22, or light emitting elements, in direct-coupled emissive array (DCEA) 20. Unlike the conventional arrangement of FIG. 2, where emitter pixels 22 are fabricated on conventional glass substrate 24, emitter pixels 22 in the present invention are fabricated on a specialized component hereafter called optically coupled substrate 25. Optically coupled substrate 25 is formed from a glass material, similar to that used in conventional glass substrate 24, but has been preprocessed with the embedment of a lenslet array structure. The lenslet array structure is made up of multiple lens elements 15, wherein each emitter pixel 22 is aligned with a corresponding lens element 15. Using the arrangement of FIG. 3a, a large fraction of light rays R from an emitter pixel 22 reaches the corresponding lens element 15 and are redirected to restrict the degree of lateral spreading. This improves sharpness and reduces crossover effects that were noted with reference to FIG. 2. Optional baffles 36 that block stray light are provided between lens elements 15, to help reduce crosstalk effects caused by stray light from adjacent emitter pixels 22; they are helpful for further optimizing the sharpness and contrast of the printing system. In printers where a small amount of blurring may be desired, such as for hiding pixelation artifacts, appropriate size of baffles can be employed to achieve a controlled level of system contrast. In one embodiment, baffles 36 are formed with a light absorbing material, for example.

In the preferred embodiment, optically coupled substrate 25 comprises a glass structure with flat surfaces, an input surface 29 and an output surface 31, and having internally formed light-directing lens elements 15 embedded therein. The input surface 29 is used for the fabrication of emitter pixels 22, and the output surface 31 is placed in contact with photosensitive medium 16 when used in contact printing. Each of the embedded lens element 15 is a precise region of glass with a predetermined refractive index distribution, effectively functioning as a lens; it refracts incident light much like the curved surface of a conventional lens. Embedded lens element 15 structure can be formed by conventional ion exchange and photolithographic techniques. An example of a commercial product that can be used to provide optically coupled substrate 25 is the planar microlens (PML) array available from NSG America Inc., Somerset, N.J. PML arrays are fabricated by diffusing ions through a photolithographic mask into a glass substrate, thereby forming planar lenslets as lens-shaped areas having a modified index of refraction within the glass substrate. Both input and output surfaces of the PML array are flat, allowing the PML array itself to be handled and mounted simply as a flat piece of glass. In the bottom-emitting DCEA embodiment of FIG. 3a, using a PML array, OLED emitter pixels 22 can be directly fabricated onto input surface 29 of the PML array so that each emitter pixel 22 is matched in position to a corresponding embedded lens element 15. The embedded lens elements 15 provide direct coupling of emitted light rays R from each emitter pixel 22 to the output surface 31 of DCEA 20, thereby maintaining a well-focused spot for exposing photosensitive medium 16.

Referring back to FIG. 3a, it is instructive to consider typical dimensional ranges for the DCEA 20 in the present invention. Pitch P between emitter pixels 22 is typically in the range of 100 microns. When used in a contact printing configuration, this pixel pitch yields approximately 250 pixels per inch. This resolution has been shown to be sufficient to provide high quality prints for many types of consumer and commercial imaging applications. Thickness T for optically coupled substrate 25 is typically in the range of 100 microns. Width L of emitter pixel 22 and, correspondingly, of lens element 15, is on the order of approximately 50 microns. The dimensions cited are for illustrative purposes; to some degree, suitable dimensions can be appropriately selected to provide the print quality desired for a given output size.

Figure 3B:
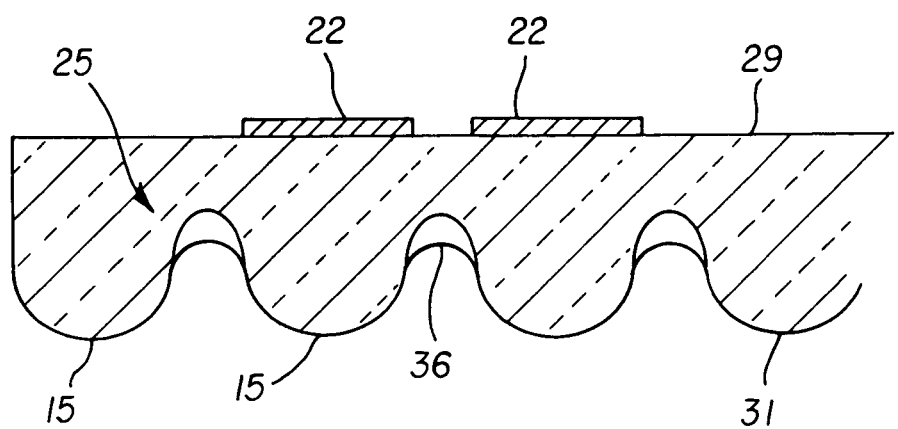
FIG. 3b is a cross-sectional side view of a direct-coupled emissive array device in one embodiment of the present invention.

As an alternative embodiment, shown in FIG. 3b, optically coupled substrate 25 may have an input surface 29 that is smooth and an output surface 31 having contoured surface structures. In a bottom-emitting DCEA 20, the smooth input surface 29 is used for depositing emitter pixels 22, while the contoured surface structures function as light-directing lens elements 15. Each emitter pixel 22 is fabricated on optically coupled substrate 25 to align with a single lens element 15. The lens elements 15 perform similar light-redirecting function as those in the preferred embodiment to reduce light spreading and increase sharpness and contrast. They can be formed as contoured surface features by micro-electromechanical systems (MEMS) fabrication techniques. This type of techniques is used, for example, to form monolithic lenslet modules (MLM) manufactured by Adaptive Optics Associates, Inc., Cambridge, Mass. Optional baffles can also be formed in areas between adjacent lens elements by the use of light absorbing surface coatings, for example.

Figure 3C:
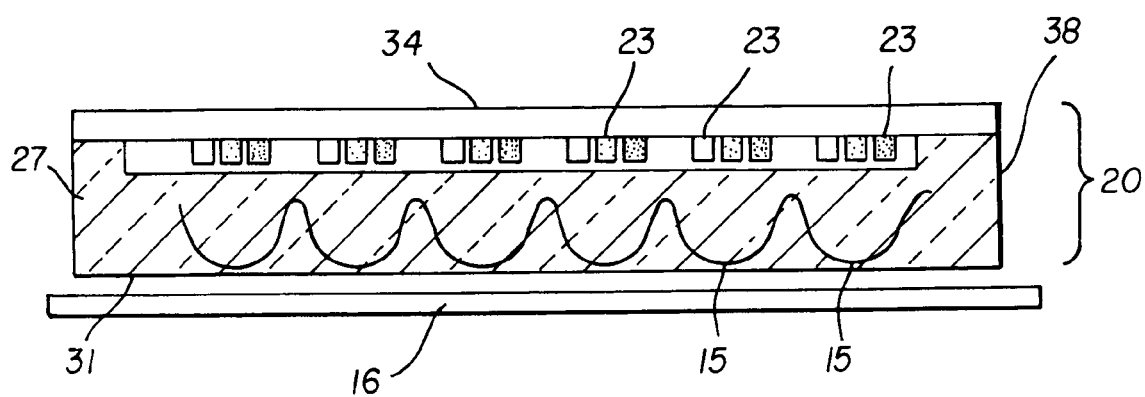
FIG. 3c is a cross-sectional side view of an optical printhead for directing light to a photosensitive medium using a direct-coupled emissive array in a top-emitting arrangement.

Now referring to FIG. 3c, a printer using DCEA 20 can also be implemented with a top-emitting configuration. A top-emitting DCEA device emits light through the encapsulating cover, and not the substrate. For the FIG. 3c embodiment, OLED emitter pixels 22 are fabricated onto a backing plate 34. Groups of tri-color emitter pixels 23 are shown in the figure; they could be replaced by an array of single emitter pixels 22 (in this and subsequent figures) for monochromatic devices. An optically coupled glass structure 27, such as a PML array, containing lens elements 15 matched to the tri-color emitter pixels 23 is used as part of an encapsulating seal 38 over the OLED emitters. As an option (not shown in FIG. 3c), a MLM can also be used as the optically coupled glass structure 27. The output surface 31 of the optically coupled glass structure 27 is positioned against photosensitive medium 16. The lens element 15 structure in the encapsulating seal 38 provide the optical coupling for focusing the emitted light onto photosensitive medium 16. This compact arrangement allows DCEA 20 to be disposed very near to photosensitive medium 16, an ideal configuration for contact printing.

Figure 4A:
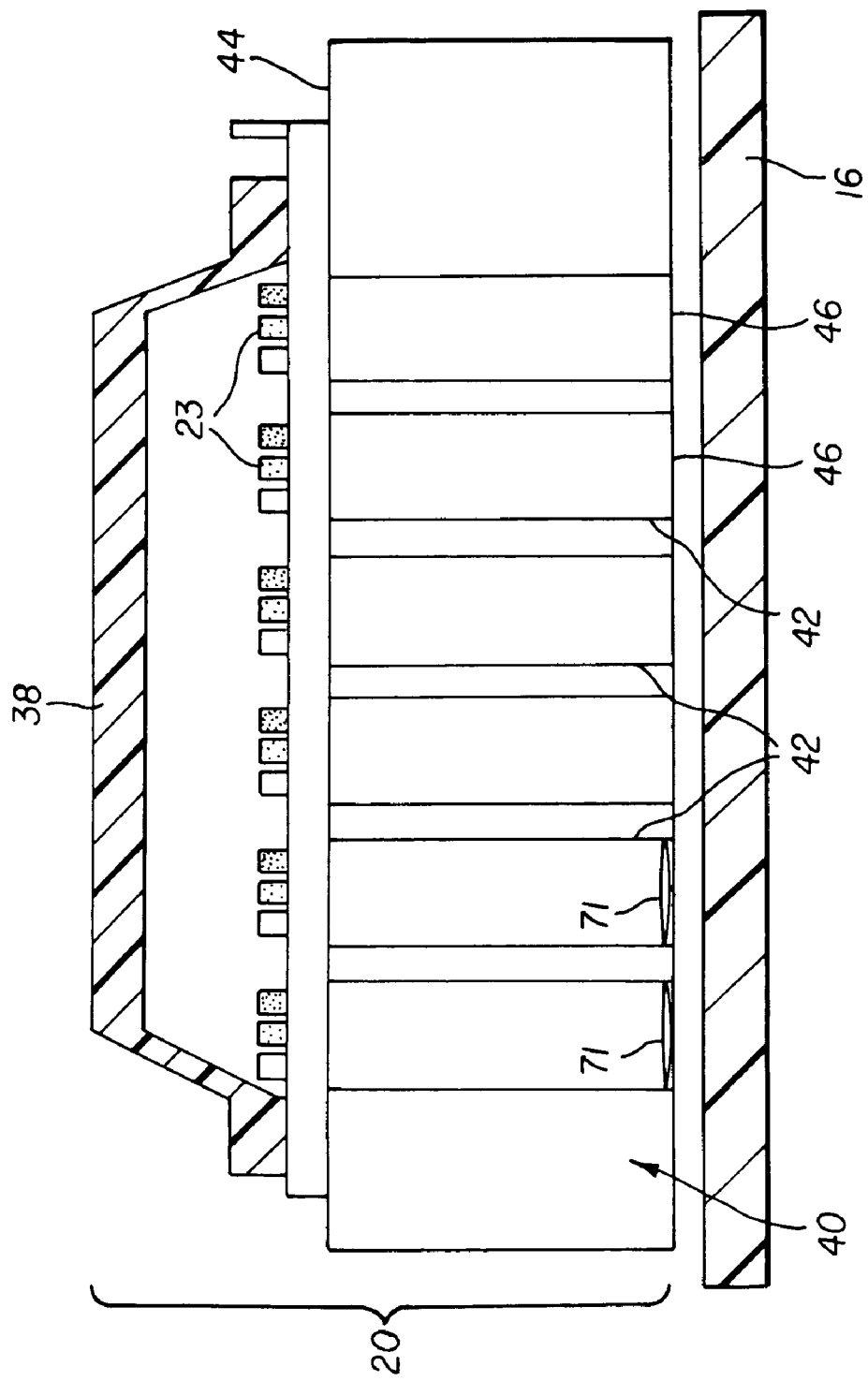
FIG. 4a is a cross-sectional side view of a direct-coupled optical printhead that comprises a fiber optic faceplate in a bottom-emitting arrangement.
Figure 5A:
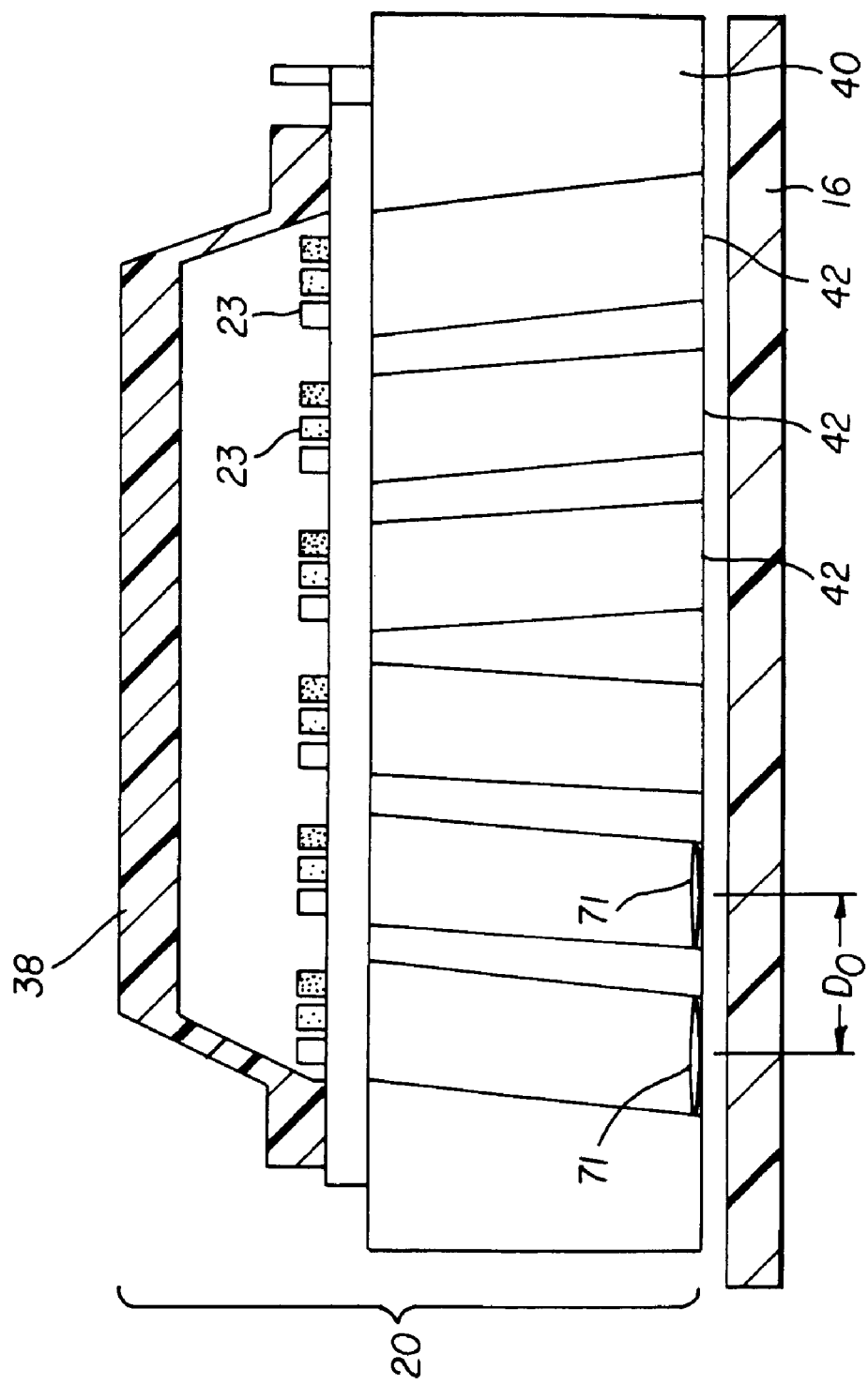
FIGS. 5a and 5b are cross-sectional side views of a direct-coupled optical printhead for contact printing comprising a tapered fiber optic faceplate.
Figure 5B:
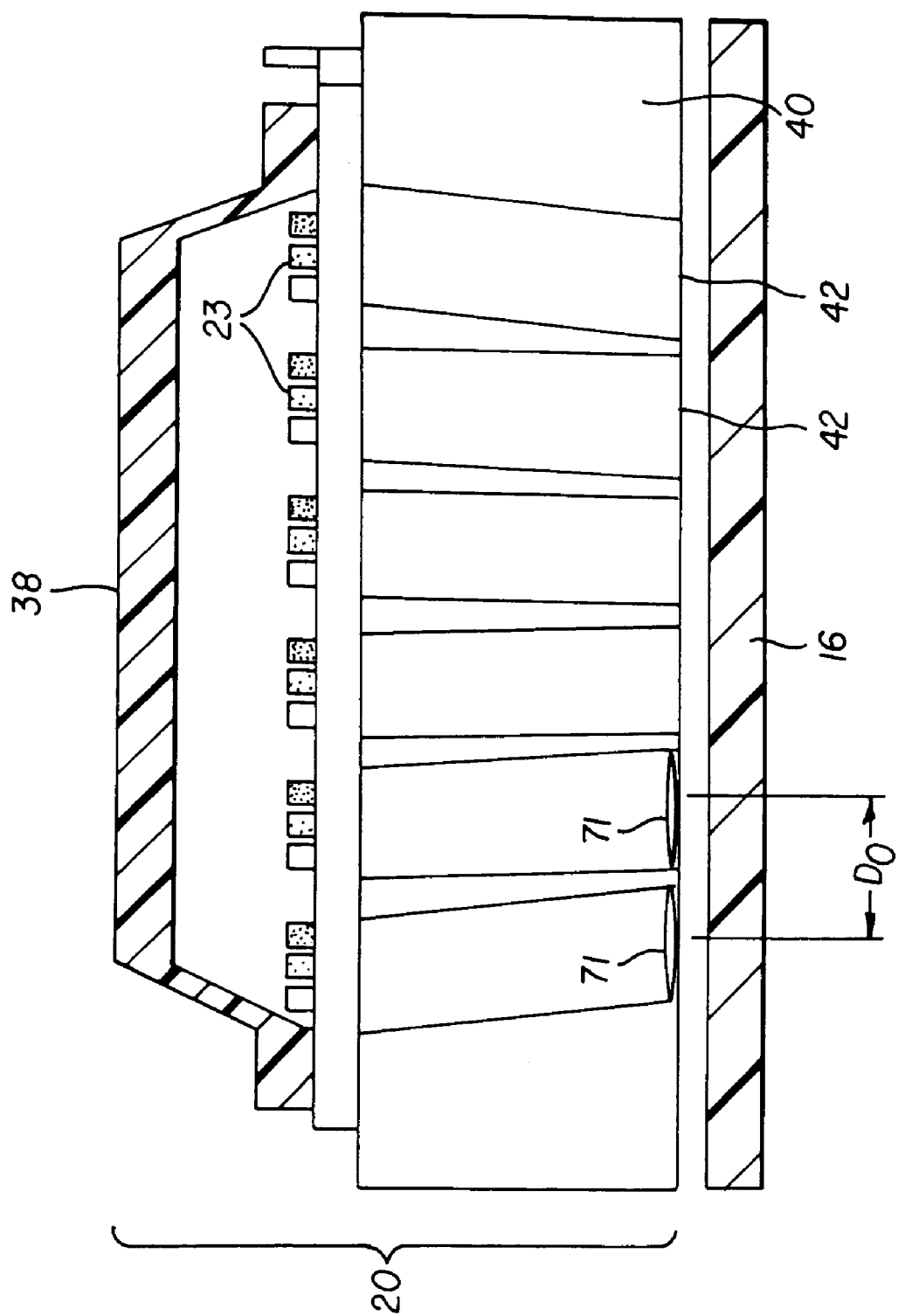

In addition to lens elements 15, optically coupled substrate 25 with other alternative light-directing structures could be employed for fabrication of DCEA 20. Referring to FIGS. 4a, 5a, and 5b, there are shown embodiments with emitter pixels 22 fabricated on a surface 44 of a fiber optic faceplate 40 for use in a contact printer. In the arrangements of FIGS. 4a, 5a, and 5b, DCEA 20 is shown in a bottom-emitting configuration. Fiber optic faceplate 40 comprises an array of light pipes 42 for directing light from each tri-color emitter pixel 23 onto photosensitive medium 16 to form a print pixel 71. At the output side, light pipes 42 are generally normal to the surface of photosensitive medium 16. Suitable fiber optic faceplates 40 are commercially available, for example, from Schott Corporation, Yonkers, N.Y. Preferably the diameter of the fibers in the faceplate is approximately equal to or smaller than the diameter of the light emitting pixels 23 in the DCEA 20, such that at least one fiber transmits light from each emitter pixel 23. With the arrangement of FIGS. 4a, 5a, and 5b, light from each emitter pixel 23 is transferred, with minimal dispersion, through fiber optic faceplate 40 and onto photosensitive medium 16 to form a print pixel 71. Significantly, light rays from tri-color emitter pixel 23 do not propagate horizontally through the substrate of fiber optic faceplate 40, thus eliminating lateral spreading as would occur within a conventional glass substrate. For contact printing configuration, photosensitive medium 16 is placed directly against the output end 46 of fiber optic faceplate 40.

Figure 4B:
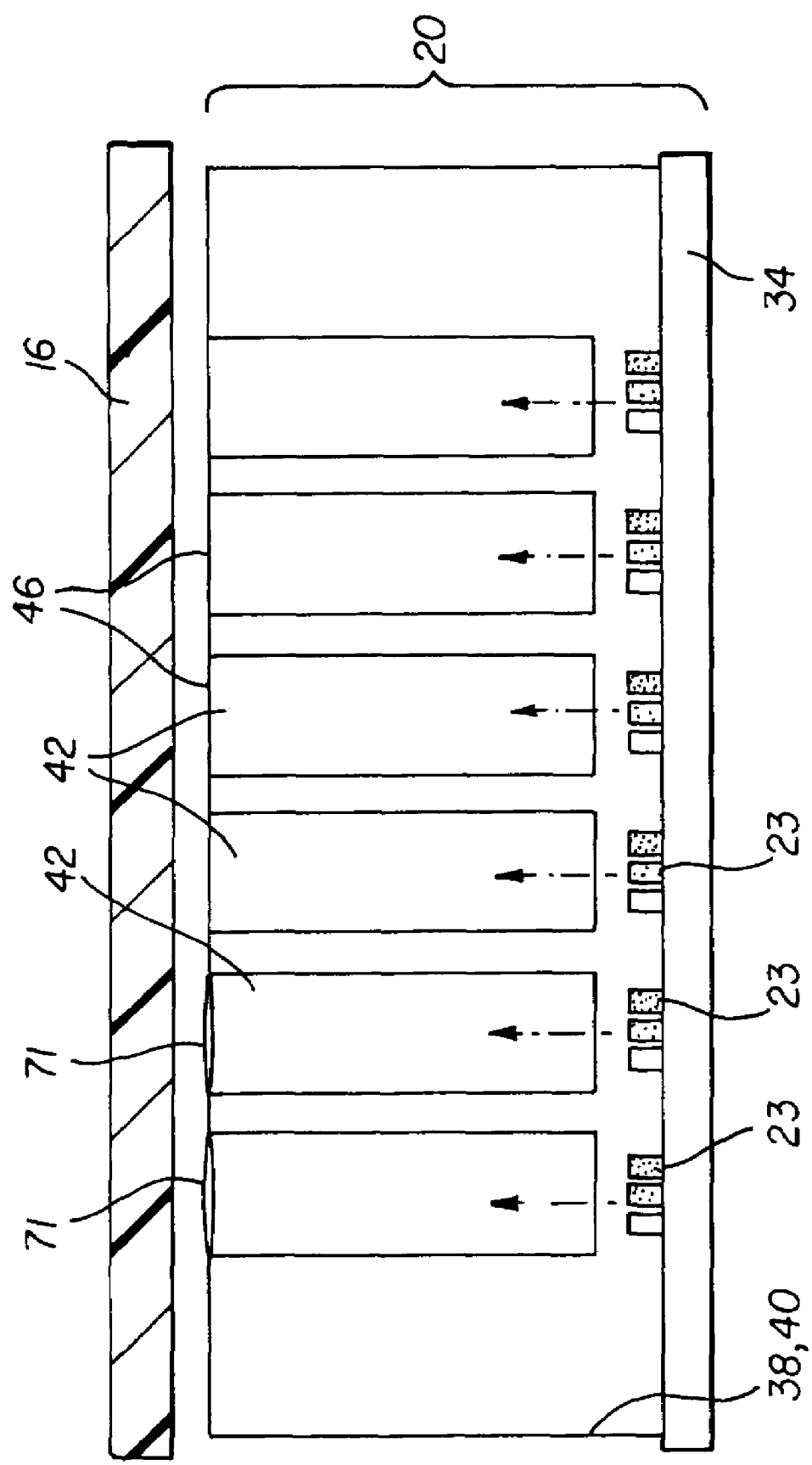
FIG. 4b is a cross-sectional side view of a direct-coupled optical printhead that comprises a fiber optic faceplate in a top-emitting arrangement.

Referring to FIG. 4b, there is shown an alternate arrangement for DCEA 20 in a top-emitting configuration. Here, emitter pixels 23 are fabricated on a backing plate 34, so that emitted light is provided to light pipes 42 for forming print pixels 71. Encapsulating seal 38 is built into the fiber optic face plate 40 structure in this arrangement.

With the arrangement of FIGS. 4a, 4b, 5a, and 5b, one or more light pipes 42 can be used for directing light from tri-color emitter pixel 23. Light pipes 42 can themselves be shaped to provide a lens structure at their output end. Heat, for example, could be used to round edges of output end 46 for some or all of light pipes 42 where suitable. As is shown in FIGS. 3c, 4a, 4b, 5a, and 5b, encapsulating seal 38 is provided over emitter pixels 23. Encapsulating seal 38 is needed in OLED devices, for example, to protect the OLED components from exposure to air.

In certain contact printing applications where the desired print resolution is different from the resolution of tri-color emitter pixels 23, tapered fiber optic faceplates 40 can be used, as is shown in the embodiments of FIGS. 5a and 5b. When fiber optic faceplate 40 is tapered, different sides of fiber optic faceplate 40 have different dimensions, with different spacing between light pipes 42 at input and output sides. FIG. 5a shows a tapered arrangement of fiber optic faceplate 40, in which light pipes 42 increase the distance $D_o$ between print pixels 71 at the output plane, relative to the spacing of emitter pixels 23 in DCEA 20, effectively providing a "magnification" of the image formed by tri-color emitter pixels 23. Conversely, FIG. 5b shows a tapered arrangement of fiber optic faceplate 40, in which light pipes 42 decrease the distance $D_o$ between print pixels 71 at the output plane relative to the spacing of tri-color emitter pixels 23 in DCEA 20, effectively providing a "de-magnification" of the image formed by tri-color emitter pixels 23. Individual light pipes 42 could also be tapered or shaped, such as to provide improved light collection or for more accurate spacing between light pipes at the output, for example. By selecting tapered fiber optic faceplate 40 with the appropriate magnification ratio, the resolution of DCEA 20 can be adapted to the needed resolution of an output print within a given range. Tapering techniques could be used with either bottom- or top-emitting configurations.

Printer Design

Figure 6A:
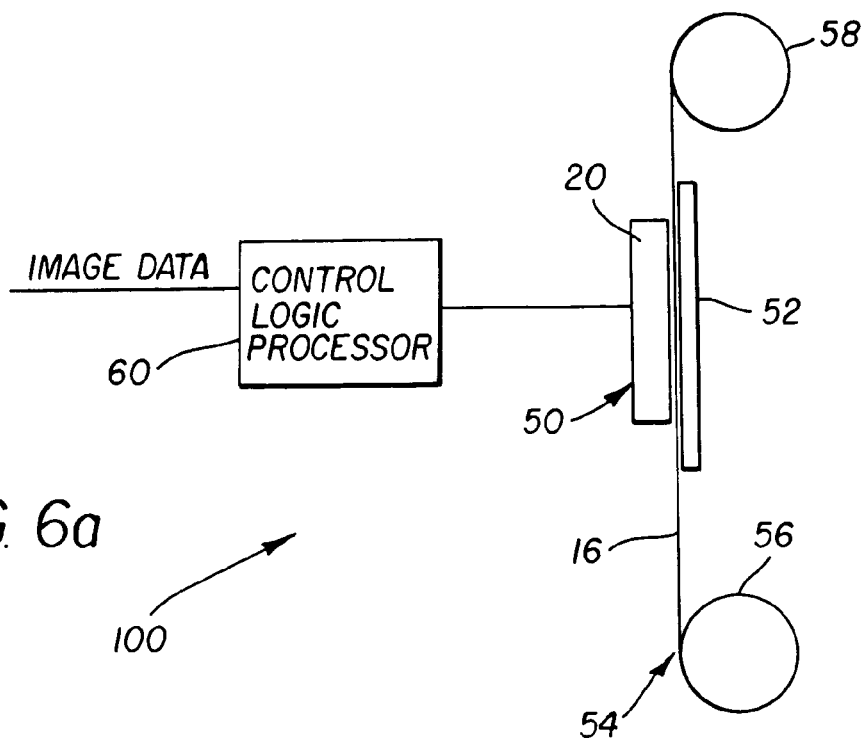
FIG. 6a is a schematic diagram showing a printing apparatus having a single direct-coupled emissive array according to the present invention.

Referring to FIG. 6a, there is shown a block diagram of one embodiment of a contact printing apparatus 100 according to the present invention. Image data is provided to a control logic processor 60, such as a Windows PC or a dedicated microprocessor, for processing the image data to control a printhead 50 which comprises DCEA 20. For exposing an image, printhead 50 is in contact with, or very nearly in contact with, the surface of photosensitive medium 16, which may be stabilized against printhead 50 by a backing element 52. A media translation apparatus 54 moves photosensitive medium 16 into position against printhead 50 for exposure. In the embodiment shown in FIG. 6a, media translation apparatus 54 is indexed to move photosensitive medium 16 by one media frame each step. Media translation apparatus 54 comprises a supply reel 56 and a take-up reel 58; alternative arrangements for supplying photosensitive medium 16 and for transporting photosensitive medium 16 past printhead 50 are well known in the imaging arts. In a simple embodiment, media translation apparatus 54 is itself optional, allowing manual loading and unloading of photosensitive medium 16 against printhead 50, such as in a hand-held printer.

Multi-Array Printhead

Figure 6B:
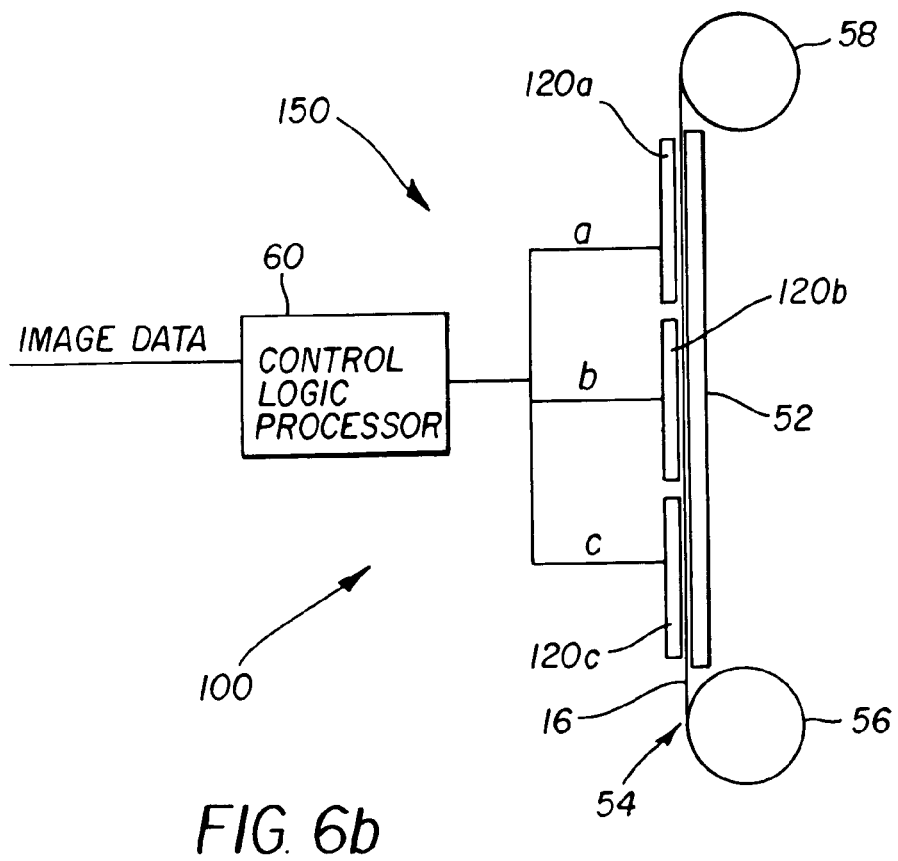
FIG. 6b is a schematic diagram showing a printing apparatus having multiple direct-coupled emissive array printheads according to the present invention.

Referring to FIG. 6b, there is shown a block diagram of another embodiment of a contact printing apparatus 100 according to the present invention. Image data from control logic processor 60 controls multi-array printhead 150 comprising a plurality of DCEA printheads 120a, 120b, and 120c. Each DCEA printhead 120a, 120b, and 120c has the basic structure as described in the present invention. For exposing an image, as was described with reference to FIG. 6a, DCEA printheads 120a, 120b, and 120c of multi-array printhead 150 are in contact with, or very nearly in contact with, the surface of photosensitive medium 16, which is stabilized against multi-array printhead 150 by a backing element 52.

Figure 6C:
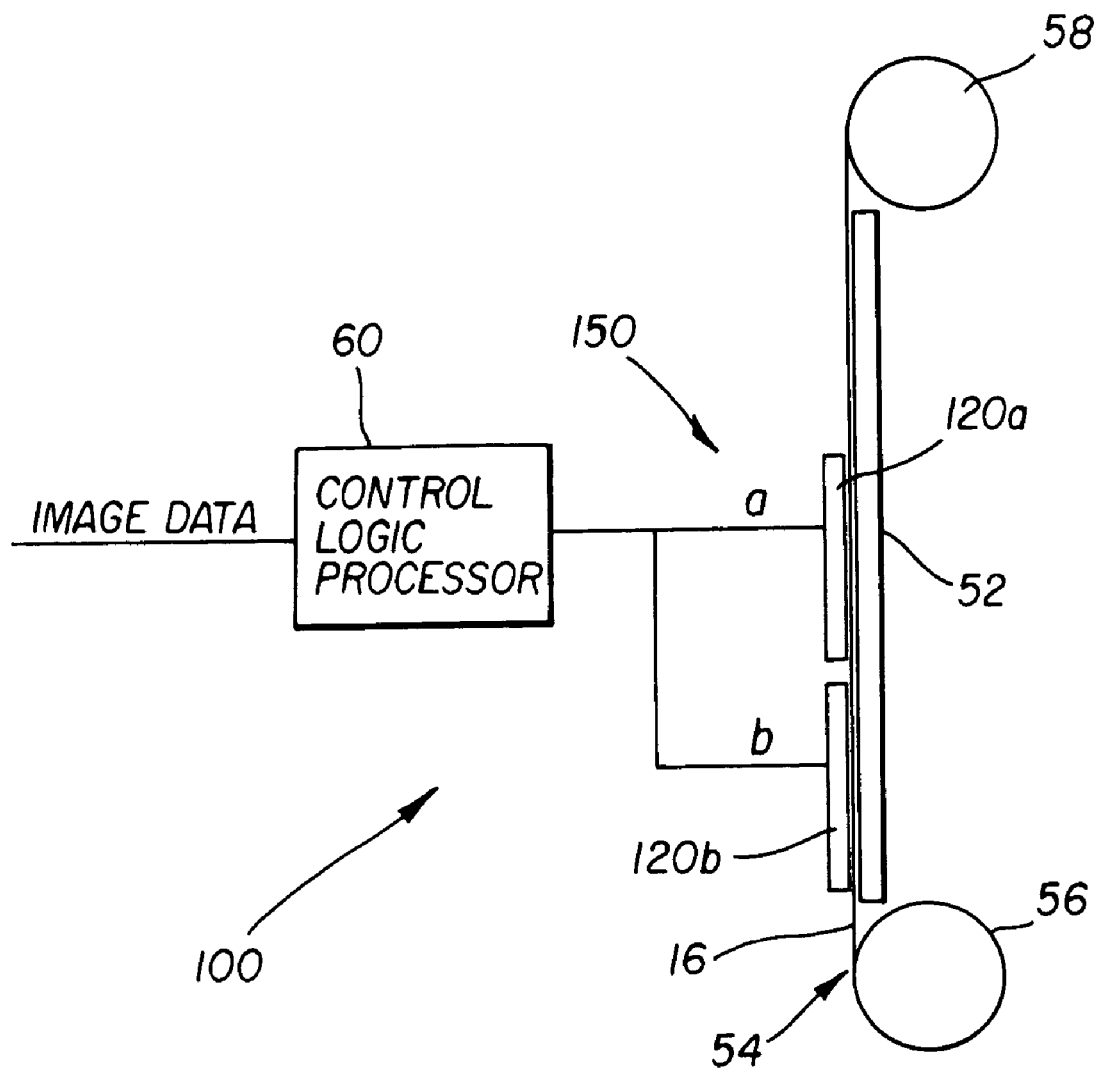
FIG. 6c is a schematic diagram showing a printing apparatus having double direct-coupled emissive array printheads according to the present invention.

Multi-array printhead 150 can be used for imaging in a number of different ways. Multiple DCEA printheads 120a, 120b, and 120c could be deployed to improve throughput speed, to provide sequential-step color imaging, to provide increased resolution by interleaving, or to provide tiled printing operation. The use of three component printheads is shown in FIG. 6b as just one possible configuration. FIG. 6c shows an alternate configuration wherein multi-array printhead 150 has only two component DCEA printheads 120a and 120b. Depending on the application, two, three, or more component DCEA printheads could be combined to provide multi-array printhead 150 in contact printing apparatus 100 as needed.

For improving throughput speed, each DCEA printhead 120a, 120b, and 120c comprises a full-color DCEA 20. Referring to FIG. 6b, each DCEA printhead 120a, 120b, and 120c is driven by a different set of full-color image data, so that three frames of photosensitive medium 16 can be simultaneously imaged. For this embodiment, media translation apparatus 54 is indexed to move photosensitive medium 16 by three media frames each step. As noted above, this arrangement could be adapted with an appropriate operating sequence for using two, three, or other suitable number of DCEA printheads 120a, 120b, and 120c.

For providing color imaging in sequential steps, each DCEA printhead 120a, 120b, and 120c can be used to provide a suitable exposure wavelength for a different color component. For example, DCEA printhead 120a could provide exposure energy for a red color component, with DCEA printheads 120b and 120c providing exposure for green and blue color components, respectively. For this type of printhead 150, media translation apparatus 54 is indexed to move photosensitive medium 16 by a single media frame for each step, as each image frame moves from one color exposure position to the next. A full-color image results from overlapping three sequential exposures made up of red, green, and blue image data, respectively. Since each single-color DCEA can have more pixel number than a full-color DCEA, sequential imaging can be used to produce higher print resolution than achievable by one full-color DCEA.

Interleaving Print Pixels

In the most straightforward embodiment, DCEA 20 has sufficient number of emitter pixels 22 and provides the desired distance $D_o$ between print pixels 71 at the output plane. By exposing two frames of image data with controlled movement of photosensitive medium 16, a higher resolution output image could be produced than may be available from DCEA 20 in a single exposure. Interleaving of print pixels could be employed to effectively multiply the resolution of DCEA 20.

Figure 7A:
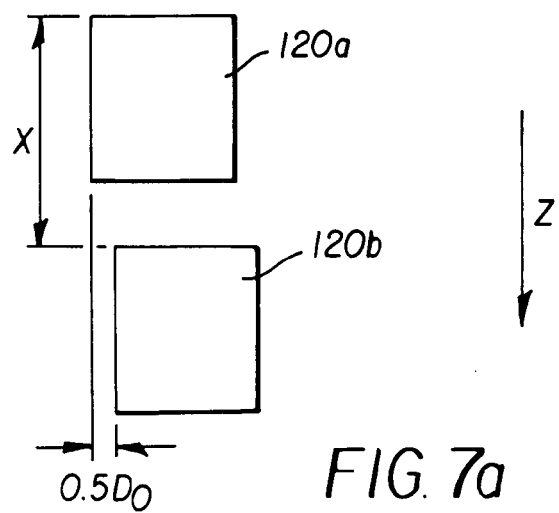
FIG. 7a is a plane view showing the respective arrangement of two direct-coupled emissive arrays for print pixel interleaving.
Figure 7B:
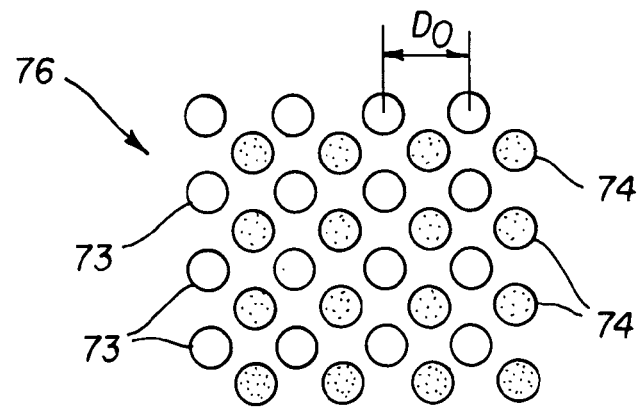
FIGS. 7b and 7c are plane views showing the arrangement of staggered pixels combined to form an interleaved image having higher resolution.

One implementation of print pixel interleaving uses a double-array printhead, comprised of two identical DCEAs, as shown in FIG. 6c. FIG. 7a is a plane view of the respective arrangement of the two DCEAs 120a and 120b, where they are separated by an amount X along media transport direction Z and misaligned with respect to each other by an amount $0.5D_o$ along the orthogonal direction. In a complete print cycle, the first DCEA 120a first exposes photosensitive medium 16 with a first frame of image data. Next, photosensitive medium 16 is moved by media translation apparatus 54 along transport direction Z by an amount $X-0.5D_o$. Then the second DCEA 120b exposes photosensitive medium 16 with a second frame of image data. The resulting print output is an interleaved image 76, made up of staggered print pixels 73 and 74 from the two DCEA's 120a and 120b, respectively, as shown in FIG. 7b. Interleaved image 76 is at twice the resolution of emitter pixels on each DCEA.

Figure 7C:
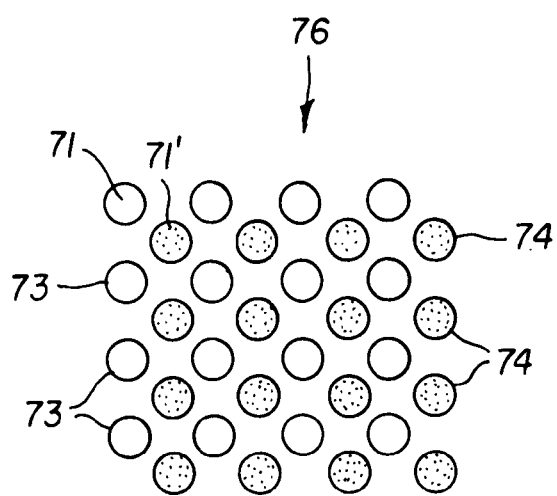

Print pixel interleaving can alternately be implemented with a single-array printhead, using the arrangement of FIG. 6a. DCEA 20 first exposes photosensitive medium 16 with a first frame of image data. Photosensitive medium 16 is then moved by media translation apparatus 54 along the diagonal direction of DCEA 20 by a distance of $0.7D_o$. Then DCEA 20 exposes photosensitive medium 16 with a new frame of image data. Referring to FIG. 7c, there is shown the arrangement of pixels printed on photosensitive medium 16 after the two exposures, showing staggered print pixels 73 and 74 from the two exposures, respectively. Accordingly, print pixels 71 and 71' are different image data printed by the same emitter pixel on DCEA 20. At the completion of the two successive exposures, interleaved image 76, which is at twice the pixel resolution of DCEA 20, is printed on photosensitive medium 16. Media translation apparatus 54 next returns to the original position and then indexes photosensitive medium 16 forward to the next media frame. Note that during the second exposure, what is required is that photosensitive medium 16 be offset by half of a print pixel in each direction with respect to DCEA 20. Instead of moving photosensitive medium 16 as described here, alternatively a translation means could be provided to offset the position of DCEA 20 by the same amount in the opposite direction.

Using the interleaving method of FIGS. 7a, 7b, and 7c, a single-array or double-array printhead could be used for achieving higher print pixel resolution. Numerous other sequences and arrangements are possible for employing staggering of print pixel locations to effectively multiply the resolution of DCEA 20.

Tiling of Direct-Coupled Emissive Arrays 20

As is disclosed in the commonly-assigned copending U.S. patent application Ser. No. 10/201,338, tiling of OLED is one approach for expanding the active area of a display, effectively allowing the use of an array of smaller arrays for displaying an image of considerably larger size.

Figure 8A:
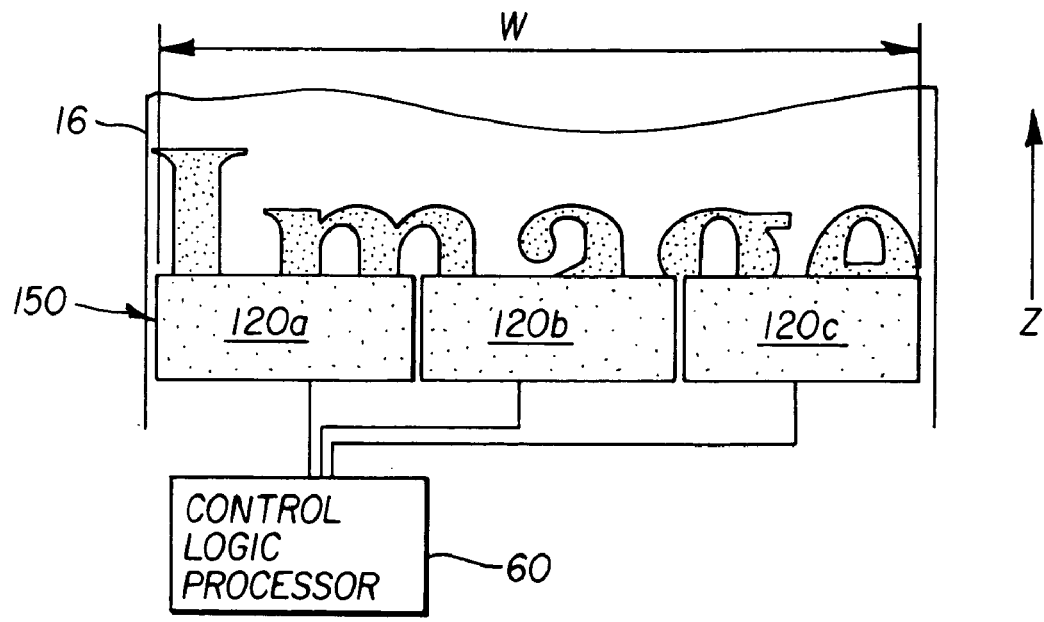
FIG. 8a is a plane view showing an arrangement in which a printhead uses a plurality of tiled direct-coupled emissive arrays.
Figure 8B:
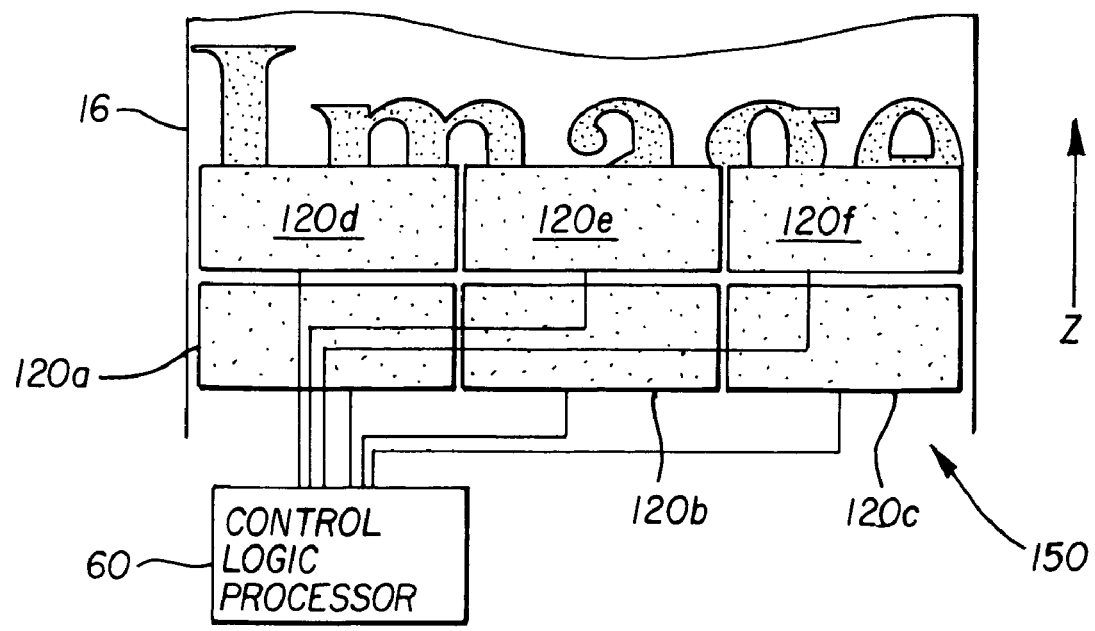
FIG. 8b is a plane view showing another arrangement in which a printhead uses a plurality of tiled direct-coupled emissive arrays.

Due to the complex requirements for intervening optics and to other factors, tiling has hitherto not been adapted for use with prior art digital printing apparatus. However, contact printing methods expand the capabilities for digital imaging, allowing tiling techniques to be employed. Referring to FIG. 8a, there is shown, from a plane view perspective, a tiling arrangement wherein multiple DCEAs 120a, 120b, and 120c are grouped together to form a combined printhead 150 with width W for imaging onto photosensitive medium 16. With the arrangement shown in FIG. 8a, photosensitive medium 16 is translated past multi-array printhead 150 in a transport direction Z during printing. Referring to FIG. 8b, there is shown, from a similar perspective, a tiling arrangement wherein six DCEA printheads 120a, 120b, 120c, 120d, 120e, and 120f are grouped in two directions, providing increased width and depth to multi-array printhead 150. An arrangement such as that shown in FIG. 8b allows tiling in unison with interleaving, enabling a range of possible resolutions and output print sizes from a single contact printing apparatus 100.

Figure 8C:
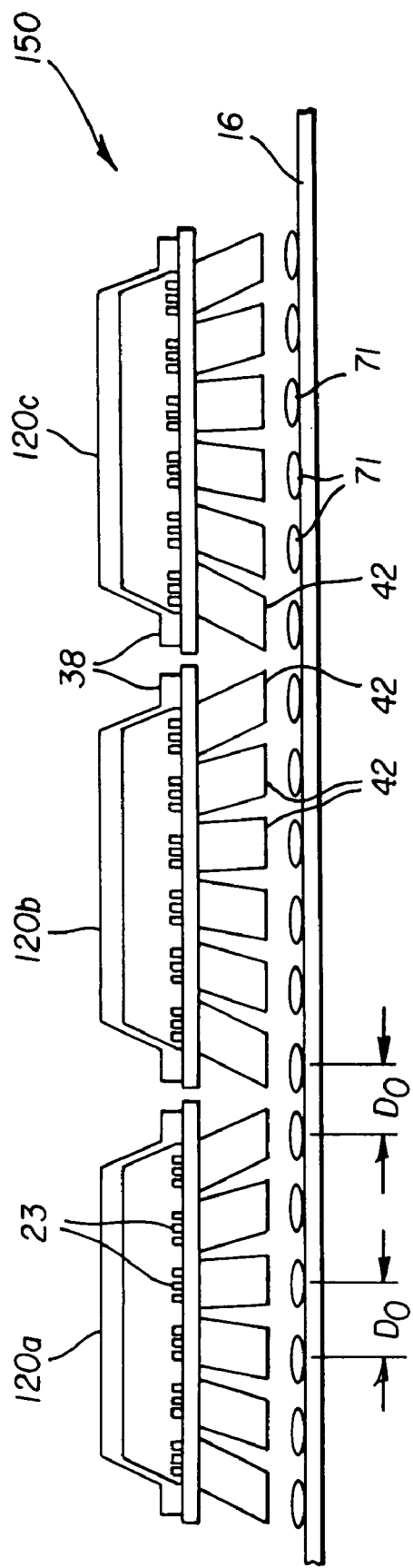
FIG. 8c is a side view in section showing a tiled arrangement of direct-coupled emissive arrays.

Referring to FIG. 8c, there is shown a cross-sectional representation of tiling of DCEA printheads 120a, 120b, and 120c for multi-array printhead 150 in the embodiment of FIG. 8a or 8b. It must be noted that FIG. 8c is illustrative only, showing only DCEAs 20 employing fiber optic faceplates and a small number of tri-color emitter pixels 23 within each DCEA printhead 120a, 120b, 120c, and is not to scale. As FIG. 8c shows, encapsulating seal 38 prevents adjacent DCEAs 20 from being butted closely together. For this reason, light pipes 42 are disposed to provide even distance $D_o$ between print pixels 71, as was described with reference to FIG. 5a. The arrangement shown in FIG. 8c can be repeated in orthogonal directions to achieve desired spacing, using as many individual DCEAs 20 as are needed.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, DCEA 20 is an OLED in a preferred embodiment, which includes the class of devices termed polymer light emitting diode (PLEDs), or could be an LED array. Other types of light-directing structures could be employed for directing light from emitter pixels 22 in DCEA 20 to print pixels 71 on photosensitive medium 16. Both monochromatic and color OLED devices can be used in DCEA 20 of the present invention. The apparatus and method of the present invention provide the combined advantages of digital imaging and contact printing, and allow high-quality imaging without the expense and space requirements of print optics external to the component that houses DCEA 20.

Other imaging techniques familiar to those skilled in the digital printing arts could be employed for further improving output print quality using the apparatus and methods of the present invention. For example, dithering techniques could be used to improve pixel fill factor and output resolution. Combinations using interleaving, tiling, and dithering could be employed to obtain a range of output print sizes and resolutions from a single printing apparatus.

Thus, what is provided is a printing apparatus and method for printing to a photosensitive medium using a direct-coupled emissive array.

| PARTS LIST | |
|---|---|
| 10 | printing apparatus |
| 14 | lens |
| 15 | lens element |
| 16 | photosensitive medium |
| 18 | backing element |
| 19 | conventional emissive array |
| 20 | direct-coupled emissive array (DCEA) |
| 22 | emitter pixel |
| 23 | tri-color emitter pixel |
| 24 | conventional glass substrate |
| 25 | optically coupled substrate |
| 26 | emitting layer |
| 27 | optically coupled glass structure |
| 28 | cathode |
| 29 | input surface |
| 31 | output surface |
| 34 | backing plate |
| 36 | baffle |
| 38 | encapsulating seal |
| 40 | fiber optic faceplate |
| 42 | light pipes |
| 44 | surface |
| 46 | output end |
| 48 | insulator |
| 50 | printhead |
| 52 | backing element |
| 54 | media translation apparatus |
| 56 | supply reel |
| 58 | take-up reel |
| 60 | control logic processor |
| 62 | electron transport layer |
| 64 | hole transport layer |
| 66 | anode |
| 71 | print pixel |
| 71' | print pixel |
| 73 | staggered print pixel |
| 74 | staggered print pixel |
| 76 | interleaved image |
| 100 | contact printing apparatus |
| 120a | direct-coupled emissive array (DCEA) printhead |
| 120b | direct-coupled emissive array (DCEA) printhead |
| 120c | direct-coupled emissive array (DCEA) printhead |
| 120d | direct-coupled emissive array (DCEA) printhead |
| 120e | direct-coupled emissive array (DCEA) printhead |
| 120f | direct-coupled emissive array (DCEA) printhead |
| 150 | multi-array printhead |

The invention claimed is:

1. A method for forming an image from digital data onto a photosensitive medium comprising:

(a) forming a first exposure image with a first emissive array and a second exposure image with a second emissive array according to the digital data, said first and second emissive arrays each comprising a plurality of individual light emitting elements, wherein each said light emitting element corresponds to a pixel in the digital data, varying the intensity of each said light emitting element according to the data value for each said pixel, said first and second emissive arrays each fabricated on a fiber optic faceplate, said fiber optic faceplate comprising a plurality of light pipes such that each said light pipe guides light from said emissive array directly onto said photosensitive medium;

(b) interleaving print pixels from said first exposure image with print pixels from said second exposure image to form an interleaved exposure image by translating the photosensitive medium to a first position for imaging print pixels against said first emissive array and to a second position for imaging print pixels against said second emissive array;

wherein the portion of said photosensitive medium imaged by said first exposure has an offset with respect to the portion of said photosensitive medium imaged by said second exposure; and wherein said offset is a fraction of a print pixel along the translating direction of said photosensitive medium and a fraction of a print pixel across the translating direction of said photosensitive medium.

2. A method for forming an image from digital data according to claim 1 wherein said first exposure image and said second exposure image are formed simultaneously.

3. A method for forming an image from digital data according to claim 1 wherein said first exposure image and said second exposure image are formed at separate time intervals to provide color-sequential imaging.

4. A method for forming an image from digital data according to claim 1 wherein the step of forming said exposure image on said first emissive array comprises the step of forming an image on an OLED.

\* \* \* \* \*